March 9, 1971 J. G. CUTILLO ET AL 3,568,296
METHOD OF FORMING HOLES
Filed Jan. 14, 1969

INVENTORS
JOSEPH G. CUTILLO
JOHN E. LINSKY

BY K. P. Johnson
ATTORNEY

United States Patent Office 3,568,296

Patented Mar. 9, 1971

3,568,296
METHOD OF FORMING HOLES

Joseph G. Cutillo, Endwell, and John E. Linsky, Binghamton, N.Y., assignors to International Business Machines Corporation, Armonk, N.Y.

Filed Jan. 14, 1969, Ser. No. 791,117
Int. Cl. B23p 17/00; H05k 3/04
U.S. Cl. 29—424 8 Claims

ABSTRACT OF THE DISCLOSURE

A process for drilling holes with reduced burr size at the exit edges of the holes which includes the steps of electrophoretically depositing a polymeric coating on the exit surface of the drilled member prior to drilling, curing the coating, drilling the holes and thereafter removing the cured coating.

BACKGROUND OF THE INVENTION

Figures 2, 3, 4, 5, 6, 7:
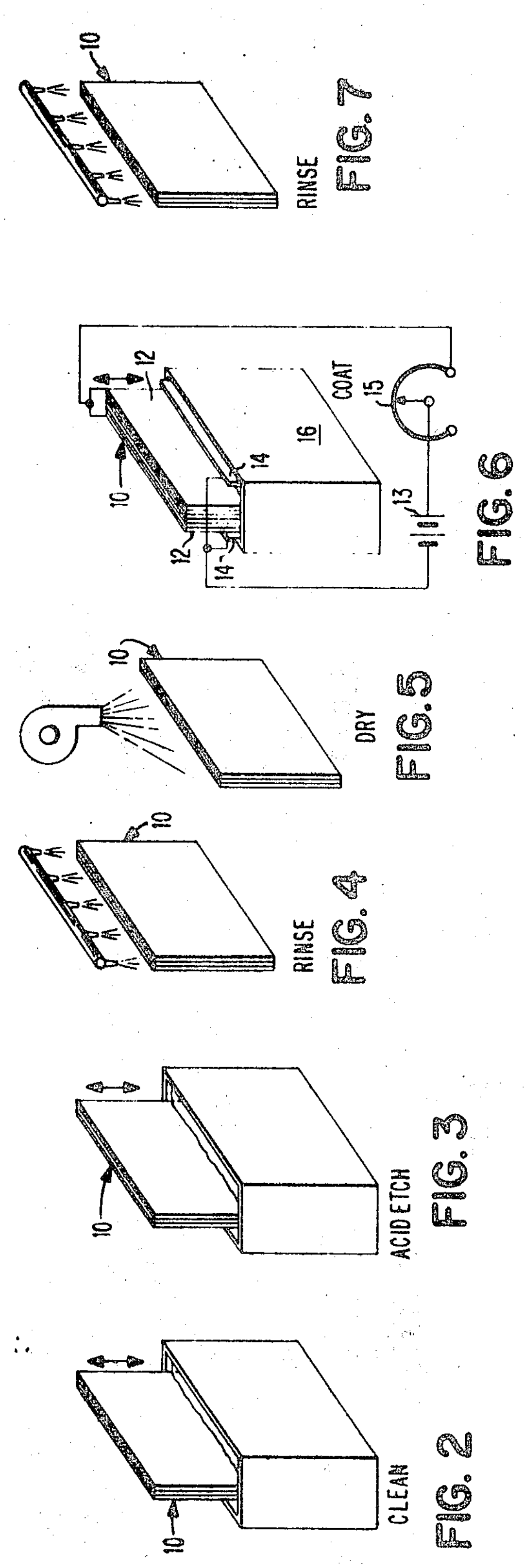

In the manufacture of printed circuit panels, interconnections extend between the circuit lines on the opposite major surfaces of a panel to electrically link selected lines. After the holes have been formed, usually by drilling, they holes through the panel which is a laminate of dielectric or insulative material with a thin conductive metal foil, such as copper, on one or both of the major surfaces. The holes are formed at preselected locations called "lands" which will be formed subsequently as part of a conductive line on the surface by etching the metal foil. After the holes have been formed, usually by drilling, they may be cleaned by passing a fluid therethrough to remove loose particles and smooth the edges of the hole preparatory to being plated with conductive metal by either the electroless or electrolytic methods. Pins may also be inserted in the holes and soldered to the circuit lands as an alternative method.

Although the holes may be formed through the metal foil layers and insulative layer by etching, the most economical and simplest procedure is to drill the holes. One well-known common disadvantage with the drilling method, however, is the resulting burrs on the exit side of the hole. These burrs can loosen or be flattened during the subsequent processing and cause short circuits between adjacent circuit lines. The usual and well-known method to reduce the size and number of burrs at the hole edges is to use a back-up support sheet which is pressed adjacent the exit side of the holes during the drilling process. After the holes have been drilled, the back-up sheet is discarded. Each board is used only once due to repositioning difficulty. By then placing the drilled panel in a slurry containing abrasive particles, the holes can be placed in acceptable condition.

The use of back-up boards has generally proven satisfactory in the control of burr size, but there are still several disadvantages which add significantly to the cost of manufacture. For instance, the use of back-up boards requires the handling of extra pieces and in certain situations where extremely small holes were desired, the boards must be individually taped to the circuit panel to prevent relative movement during drilling. Another drawback is the material cost for the back-up boards and the subsequent disposal necessitated after a board has been used for drilling. In some of the drilling machines, there is a limited space between the drill tips in the raised position and the work support so that the back-up boards take up valuable space when processing multiple circuit panels for a single drilling operation.

It is accordingly a primary object of this invention to provide a process for drilling holes which is less expensive than the present methods and also results in reduced burr size at the exit side of circuit panel holes.

It is another object of this invention to provide a method of drilling printed circuit panels with easier handling while at the same time providing a protective coating.

Another object of this invention is to provide a method of drilling printed circuit panels which is of improved efficiency and significantly reduces the cost of back-up material for the drilled holes.

SUMMARY OF THE INVENTION

The foregoing objects are attained by the present invention which generally comprises electrophoretically depositing a curable polymer on the metal foil surface of a circuit panel at the exit side of drilled holes, and thereafter curing the deposited polymer and then drilling the holes. Upon completion of the drilling, the polymeric coating is removed by dipping in a commercial stripping solution. The polymeric coating adheres well to the surface of the metal foil such that the quantity and size of burrs are significantly reduced over the use of back-up boards.

The electrophoretic deposition of the coating reduces the difficulty in handling the extra pieces of back-up board and reduces the cost of back-up material to a small fraction of that when the boards are used for the support. The process of the invention also eliminates the necessity of taping back-up boards and sharply reduces the disposal cost heretofore experienced with the boards. The polymeric coating required for the control of burr size can be much thinner than the back-up boards, thus permitting more printed circuit panels to be drilled simultaneously by the drilling machines. The decrease in thickness of the back-up support significantly prolongs drill life.

Figures 1, 8, 9, 10, 11:
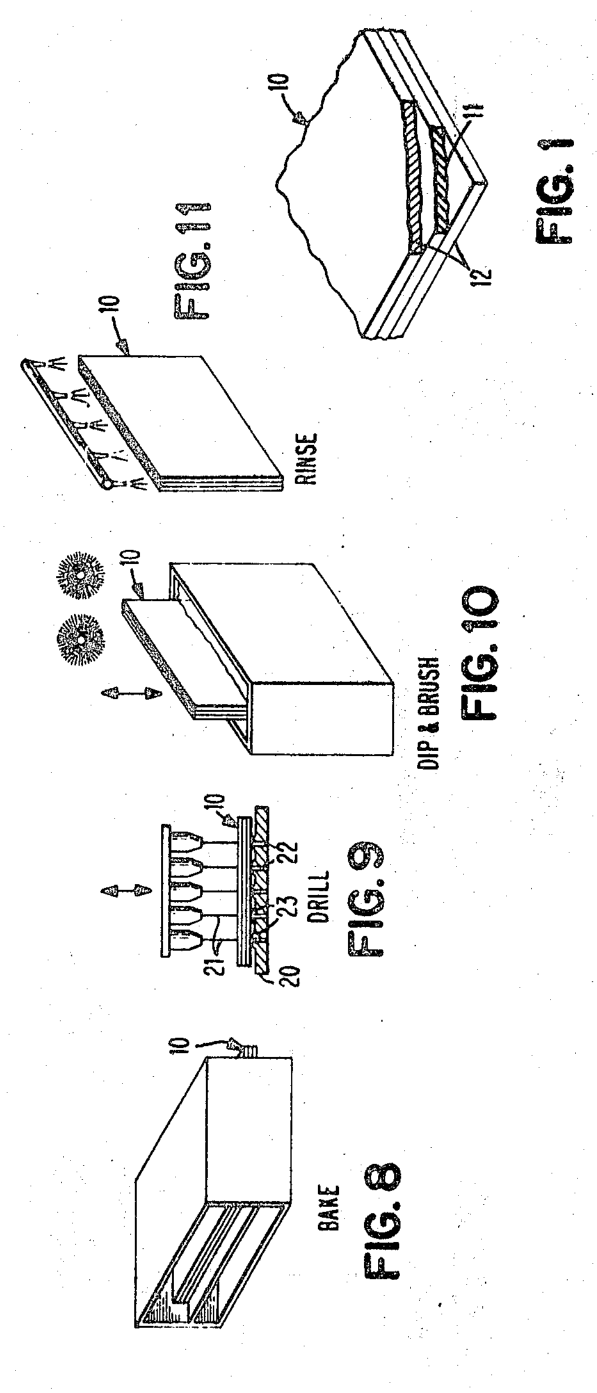

The foregoing and other objects, features and advantages of the invention will be apparent from the following more particular description of a preferred embodiment of the invention as illustrated in the accompanying drawings, wherein:

FIG. 1 is a partial sectional view of a printed circuit panel as it would appear prior to drilling holes therein; and FIGS. 2 through 11 are sketches of the several processing steps performed in accordance with the invention to produce holes in the panel shown in FIG. 1.

DESCRIPTION OF A PREFERRED EMBODIMENT

A printed circuit panel 10 generally appears as shown in FIG. 1 immediately prior to the drilling operation. Layers 11 of glass fiber cloth, impregnated with an epoxy resin, are laminated with thin, electrically-conductive layers 12 of metal foil on the two major surfaces thereof. Foil such as copper is laminated on one or both surfaces depending on where circuit lines are to be formed. The foil can be selectively etched subsequent to the drilling operation to form circuit lines.

The processing steps of circuit panels when drilled in accordance with the invention are illustrated in FIGS. 2 through 11. After lamination of the glass cloth and foil is completed, the panels are thoroughly cleaned to remove dirt and grease by dipping, as indicated in FIG. 2. The bath may consist of a reverse alkaline cleaner such as "K-2," a commercially available product of the Pennsalt Chemical Corp. of Philadelphia, Pa. This is done to remove any contamination that may be present on the surfaces. An alternative is to use a conventional degreaser as the bath.

The panels are removed from the cleaning bath and dipped in an acid bath (FIG. 3) for about 30 seconds, to remove any oxide that may be present on the surface of the metal foil. When copper foil is used, the bath may be dilute hydrochloric acid such as a 10% solution at room temperature. The panels are then removed from the acid and rinsed in water as indicated in FIG. 4 and thereafter dried by forced air as indicated in FIG. 5.

The panel is now ready for electrophoretic coating of a water-based polymeric resin on the conductive metal surface which will be the exit side for the drilled holes. This is shown in FIG. 6. The copper foil 12 to be coated is connected with the positive terminal of a D.C. voltage source 13 as the anode, and cathode plate 14 is connected to the negative terminal of source 13. A potentiometer 15 is placed in series with the source to increase the applied voltage as coating progresses. As shown, two panels may be placed back-to-back in tank 16 so that a single surface on each is coated simultaneously with the other.

An example of a resin suitable for the drilling application is an alkyd amine known as "Electrocoat IR-1540," commercially available from the Mobil Chemical Company of Cleveland, Ohio. The material as supplied contains 40% to 60% solids with a pH of 7.2–7.3. The consistency is adjusted with deionized water to approximately 10% solids and the pH is adjusted to fall within a range of 7.7–8.3. The alkalinity is increased by adding ammonia or organic amines such as N-N, dimethylethonolamine. The temperature of the coating bath is maintained at approximately 72° F.

Coating is accomplished by using a 100 volt D.C. source and varying potentiometer 15 to increase the applied voltage as coating progresses. One method is to steadily increase the voltage from 0 to 40 volts over a time period of one minute. Thereafter the voltage is increased by 10 volt increments and left at each step for 30 seconds. This procedure results in a coating approximately 0.001 inch thick. In some applications, a thickness of 0.0005 inch may be sufficient. The applied voltage may be varied in different manners and periods of time to produce the thicknesses required. Caution should be used in applying the voltage to prevent exceeding the breakdown potential of the polymer as it is being coated on the panel.

After the alkyd amine coating has been applied, the panel is removed from the bath for curing. The panel is first rinsed in deionized water upon removal as indicated in FIG. 7. Rinsing removes excess bath solution. Thereafter the panel is baked to cure the resin as shown in FIG. 8. For "IR-1540" the coating will cure at temperatures above 135° C., and the coating is preferably cured at a temperature of 150° to 155° C. for 20 minutes to cross-link the polymer.

At this stage the control panel is ready to be drilled as shown in FIG. 9. The panel 10 is positioned on work support 20 under drills 21 which are operated in the conventional manner. The panel is placed on the support with the coated side down adjacent clearance holes 22 in the support. The clearance holes are generally 0.015 to 0.017 inch larger in diameter than the largest diameter drills. It has been found advantageous if the work support is formed with semispherical projections 23 at each clearance hole site. These projections concentrate the supporting force near the hole site and further reduce the occurrence of burrs.

Upon completion of the drilling operation the panel is dipped 3 to 4 minutes in a stripping solution generally comprising methylene chloride at room temperature. (See FIG. 10.) A satisfactory solution that is commercially available is "PR-491" from the Allied Finishing Specialties Co., Chicago, Ill. The latter solution is effective within approximately 30 seconds at room temperature. Most photo-resist stripping solutions are usually effective but over varying times. The solution softens the coating so that light brushing can then be used to remove the coating. The stripped panel may thereafter be rinsed in deionized water, as indicated in FIG. 11.

As with the usual practice, the drilled holes are now cleaned with a slurry of silica and water to remove bits of loose metal and glass-epoxy that may remain in the holes. Such processing is always required to clean holes when drilled with a back-up board.

The process described above reduces both the size and number of burrs at the hole edges, and also serves as a protective coating for the metal foil until drilling is completed. The coating is much thinner than the usual back-up board so that several coated panels can be drilled simultaneously. When drilling multiple panels only the bottom panel needs a cured coating since each panel serves as a back-up for the next one above.

While the invention has been particularly shown and described with reference to a preferred embodiment thereof, it will be understood by those skilled in the art that various changes in form and details may be made therein without departing from the spirit and scope of the invention.

What is claimed is:

1. A process for forming holes in a planar element having an electrically conductive surface comprising the steps of:
   - immersing said element in an organic polymeric composition;
   - electrophoretically depositing a coating of the polymer contained in said composition on said conductive surface; and
   - curing said coating after the deposition thereof on said surface;
   - drilling at least one hole through said element, said element being oriented with said coated surface at the exit end of the hole.

2. The process described in claim 1 wherein said polymeric composition is a water-based emulsion.

3. The process described in claim 1 wherein said polymeric composition is a water based alkyd emulsion.

4. The process described in claim 1 wherein said deposition is sufficient to produce a coating of at least 0.0005 inch when cured.

5. The process described in claim 1 further comprising the step of immersing the drilled element in a stripping solution and removing said coating.

6. The process described in claim 1 wherein said deposited coating is cured by subjecting said coating to a temperature of at least 130° C.

7. The process described in claim 1 wherein said element is supported for drilling on a surface having a supporting projection thereon corresponding to each hole to be drilled, with each said projection having a clearance hole for a drill formed therein.

8. The process described in claim 5 wherein said stripping solution includes organic solvents and said coating is removed by brushing.

References Cited

UNITED STATES PATENTS

| | | | |
|---|---|---|---|
| 2,961,746 | 11/1960 | Lyman | 29—527.2X |
| 3,052,019 | 9/1962 | Strasser | 29—424 |
| 3,348,990 | 10/1967 | Zimmerman et al. | 29—625X |

THOMAS H. EAGER, Primary Examiner

U.S. Cl. X.R

29—527.2, 625